United States Patent
Muramoto et al.

(10) Patent No.: US 10,065,380 B2
(45) Date of Patent: Sep. 4, 2018

(54) FILLER-FILLED FILM, SHEET FILM, STACKED FILM, BONDED BODY, AND METHOD FOR PRODUCING FILLER-FILLED FILM

(71) Applicant: DEXERIALS CORPORATION, Tokyo (JP)

(72) Inventors: Yutaka Muramoto, Miyagi (JP); Masanao Kikuchi, Miyagi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/523,212

(22) PCT Filed: Oct. 28, 2015

(86) PCT No.: PCT/JP2015/080344
§ 371 (c)(1),
(2) Date: Apr. 28, 2017

(87) PCT Pub. No.: WO2016/068171
PCT Pub. Date: May 6, 2016

(65) Prior Publication Data
US 2017/0320279 A1 Nov. 9, 2017

(30) Foreign Application Priority Data

Oct. 28, 2014 (JP) .................. 2014-219784
Oct. 23, 2015 (JP) .................. 2015-209377

(51) Int. Cl.
*H01L 23/00* (2006.01)
*B29D 7/01* (2006.01)
(Continued)

(52) U.S. Cl.
CPC ............. *B29D 7/01* (2013.01); *B29C 59/04* (2013.01); *B29C 59/046* (2013.01);
(Continued)

(58) Field of Classification Search
CPC ..... B29D 7/01; B29D 11/00596; B29C 59/04; B32B 3/28; G02B 27/2292;
(Continued)

(56) References Cited

U.S. PATENT DOCUMENTS 4,367,920 A * 1/1983 Tung .................. G02B 5/128
359/538
7,995,871 B2 * 8/2011 Guerra .............. H01G 9/2031
257/432
(Continued)

FOREIGN PATENT DOCUMENTS

JP 50-040671 4/1975
JP 05-329437 12/1993
(Continued)

*Primary Examiner* — Nikolay Yushin
(74) *Attorney, Agent, or Firm* — Paratus Law Group, PLLC

(57) ABSTRACT

There is provided a filler-filled film, a sheet film, a stacked film, a bonded body, and a method for producing a filler-filled film, the filler-filled film including: a film main body; a plurality of concavities formed on a surface of the film main body; and a filler put in each of the concavities. A diameter of an opening surface of the concavity is at least larger than a visible light wavelength, an arrangement pattern of the concavities has periodicity along a length direction of the film main body, and the difference between the rate of filling of the fillers in one end portion of the film main body and the rate of filling of the fillers in another portion of the film main body is less than 0.5%.

27 Claims, 10 Drawing Sheets

(51) Int. Cl.
  *H01L 23/498* (2006.01)
  *B29C 59/04* (2006.01)
  *B29D 11/00* (2006.01)
  *B32B 3/28* (2006.01)
  *G02B 27/22* (2018.01)
  *B29C 35/10* (2006.01)
  *B29K 105/16* (2006.01)
  *B29C 35/08* (2006.01)
  *B29C 59/02* (2006.01)

(52) U.S. Cl.
  CPC .. *B29D 11/00596* (2013.01); *B29D 11/00788* (2013.01); *B32B 3/28* (2013.01); *G02B 27/2292* (2013.01); *H01L 23/49816* (2013.01); *B29C 35/10* (2013.01); *B29C 2035/0827* (2013.01); *B29C 2059/023* (2013.01); *B29K 2105/16* (2013.01)

(58) Field of Classification Search
  CPC ......... H01L 23/49816; H01L 23/49822; H01L 23/49866
  See application file for complete search history.

(56) References Cited

U.S. PATENT DOCUMENTS

| | | | |
|---|---|---|---|
| 9,256,008 B2* | 2/2016 | Haguet | G01N 21/6456 |
| 9,625,684 B2* | 4/2017 | Norton | G02B 13/0085 |
| 2009/0116095 A1* | 5/2009 | Guerra | H01G 9/2031 |
| | | | 359/245 |
| 2012/0142086 A1* | 6/2012 | Haguet | G01N 21/6456 |
| | | | 435/288.7 |
| 2013/0215515 A1* | 8/2013 | Kinoshita | G02B 3/0056 |
| | | | 359/619 |
| 2014/0334021 A1* | 11/2014 | Norton | G02B 13/0085 |
| | | | 359/793 |

FOREIGN PATENT DOCUMENTS

| | | |
|---|---|---|
| JP | 2000-355048 | 12/2000 |
| JP | 2001-239627 | 9/2001 |
| JP | 2009-258751 | 11/2009 |
| JP | 2011-107405 | 6/2011 |

* cited by examiner

FILLER-FILLED FILM, SHEET FILM, STACKED FILM, BONDED BODY, AND METHOD FOR PRODUCING FILLER-FILLED FILM

CROSS REFERENCE TO PRIOR APPLICATION

This application is a National Stage Patent Application of PCT International Patent Application No. PCT/JP2015/080344 (filed on Oct. 28, 2015) under 35 U.S.C. § 371, which claims priority to Japanese Patent Application Nos. 2015-209377 (filed on Oct. 23, 2015) and 2014-219784 (filed on Oct. 28, 2014), which are all hereby incorporated by reference in their entirety.

TECHNICAL FIELD

The present invention relates to a filler-filled film, a sheet film, a stacked film, a bonded body, and a method for producing a filler-filled film.

BACKGROUND ART

These days, various embossed films are developed and used. As such an embossed film, there is known a film in which the diameter of the concavity is 1 μm or more and the arrangement pattern of concavities has periodicity along the length direction of the embossed film. That is, in such an embossed film, the same arrangement pattern is formed repeatedly in the length direction of the embossed film.

Such an embossed film is used as, for example, a filler-filled film. The filler-filled film is a film in which a filler is put in concavities of an embossed film.

Such an embossed film is produced using a stamper master. The stamper master is a master in which the inverted shape of the arrangement pattern mentioned above (that is, a plurality of convexities) is formed on the surface of a flat plate-like substrate (transfer surface). The shape of the transfer surface of the stamper master is sequentially transferred to a transfer destination film, and thereby an embossed film is produced.

CITATION LIST

Patent Literature

Patent Literature 1: JP 2009-258751A

SUMMARY OF INVENTION

Technical Problem

However, in the method of producing an embossed film using a stamper master, there has been a problem that it is very difficult to accurately perform the positioning etc. of the stamper master with respect to the transfer destination film. Hence, in an embossed film produced by this method, there has been a problem that a defect (a position shift, a loss, a warp, etc.) of a concavity is likely to occur. There may be a case where a filler is not put in a defective concavity. Furthermore, the defect of the concavity tends to become larger as the filler-filled film becomes longer. Hence, the problem that the rate of filling of fillers varies in the length direction of the filler-filled film may arise.

Patent Literature 1 discloses a method of producing a moth-eye film by a roll-to-roll system. In this method, first, a circular columnar master in which the inverted shape of a moth-eye film is formed on the peripheral surface is prepared. Then, the shape of the peripheral surface of the master is transferred to a film; thereby, a moth-eye film is produced. However, in this moth-eye film, the diameter of the concavity and the convexity is very small (less than 1 μm), and therefore the issue mentioned above cannot be solved.

Thus, the present invention has been made in view of the issue mentioned above, and an object of the present invention is to provide a new and improved filler-filled film, a sheet film, a stacked film, a bonded body, and a method for producing a filler-filled film in which the rate of filling of fillers is more stabilized.

Solution to Problem

According to an aspect of the present invention in order to achieve the above object, there is provided a filler-filled film including: a film main body; a plurality of concavities formed on a surface of the film main body; and a filler put in each of the concavities. A diameter of an opening surface of the concavity is at least larger than a visible light wavelength, an arrangement pattern of the concavities has periodicity along a length direction of the film main body, and the difference between the rate of filling of the fillers in one end portion of the film main body and the rate of filling of the fillers in another portion of the film main body is less than 0.5%.

Here, the film main body may be a long-length film.

The rate of filling of the fillers may have periodicity along the length direction of the film main body.

All the concavities may have substantially the same shape.

The number of fillers put in per unit area of the film main body may be $50,000,000/cm^2$ or less.

The filler may be integrated with the film main body in the concavity.

A coating layer formed on at least part of a surface of the film main body may be included.

The coating layer may be formed on at least part of a surface of the concavity, a surface of a convexity between ones of the concavities, and an exposed surface of the filler.

The coating layer may contain an inorganic material.

The film main body may be formed of a hardenable resin or a plastic resin.

According to another aspect of the present invention in order to achieve the above object, there is provided a sheet film produced by cutting the above filler-filled film into a plurality of sheets.

According to another aspect of the present invention in order to achieve the above object, there is provided a stacked film, in which the above film is stacked.

Here, a sticky layer formed on a back surface of the film main body may be included.

According to another aspect of the present invention in order to achieve the above object, there is provided a bonded body including: the above film; and a matrix to which the film is bonded.

According to another aspect of the present invention in order to achieve the above object, there is provided a method for producing a filler-filled film, including: a step of preparing a circular cylindrical or circular columnar master in which a plurality of convexities are formed on a peripheral surface; a step of producing a film main body by conveying a long-length transfer destination film by a roll-to-roll system and at the same time transferring a shape of the peripheral surface of the master to the transfer destination film; and a step of putting a filler in a plurality of concavities formed on a surface of the film main body. A diameter of an opening surface of the concavity is at least larger than a visible light wavelength, and the difference between the rate of filling of the fillers in one end portion of the film main body and the rate of filling of the fillers in another portion of the film main body is less than 0.5%.

In the filler-filled film according to each of the aspects mentioned above of the present invention, the difference between the rate of filling of fillers in one end portion of the film main body and the rate of filling of fillers in another portion of the film main body is less than 0.5%. Thus, the rate of filling of fillers is more stabilized.

Advantageous Effects of Invention

As described above, according to the present invention, the rate of filling of fillers is more stabilized.

DESCRIPTION OF EMBODIMENTS

Figure 1:
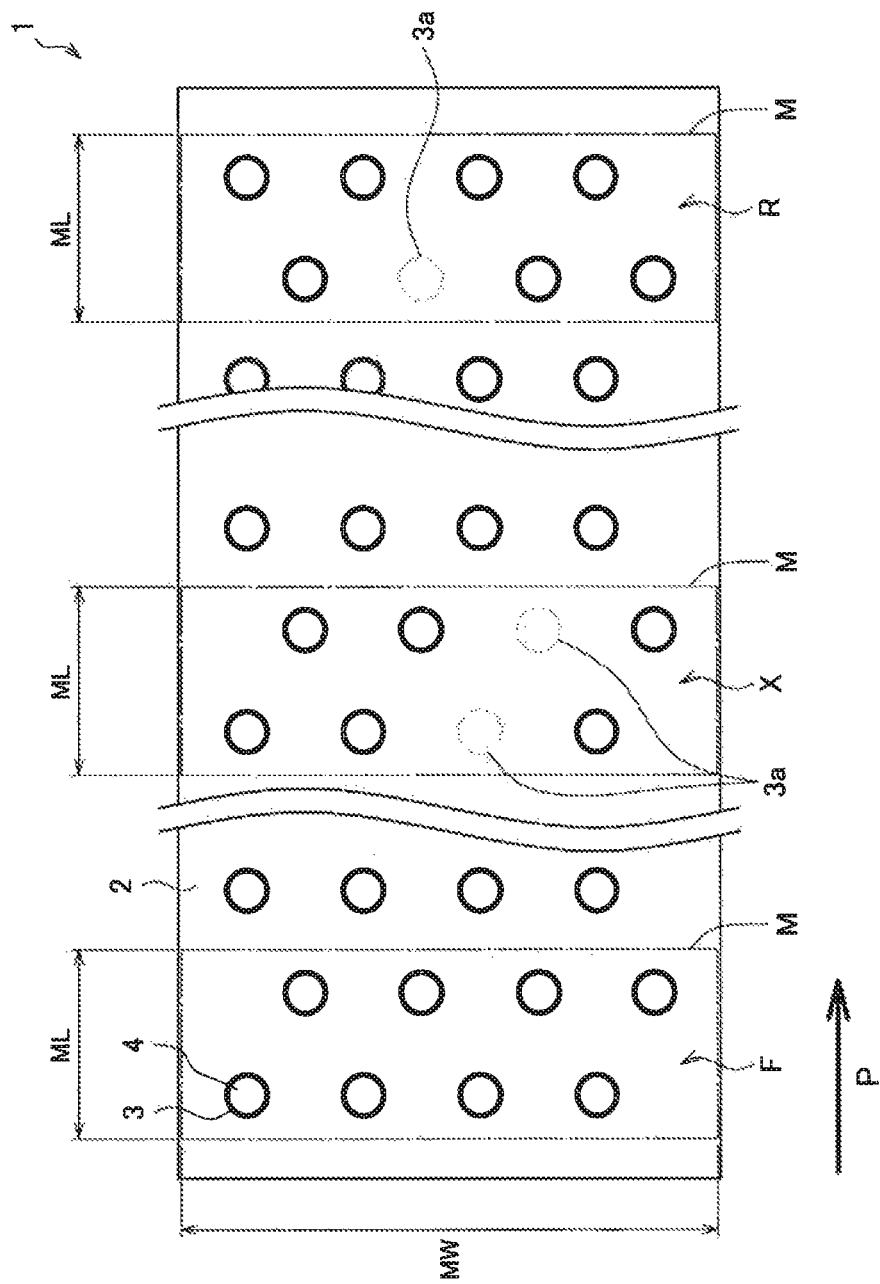
FIG. 1 is a plan view schematically showing the configuration of a filler-filled film according to an embodiment of the present invention.

Hereinafter, (a) preferred embodiment(s) of the present invention will be described in detail with reference to the appended drawings. In this specification and the appended drawings, structural elements that have substantially the same function and structure are denoted with the same reference numerals, and repeated explanation of these structural elements is omitted.

<1. Configuration of Filler-Filled Film>

Figure 2:
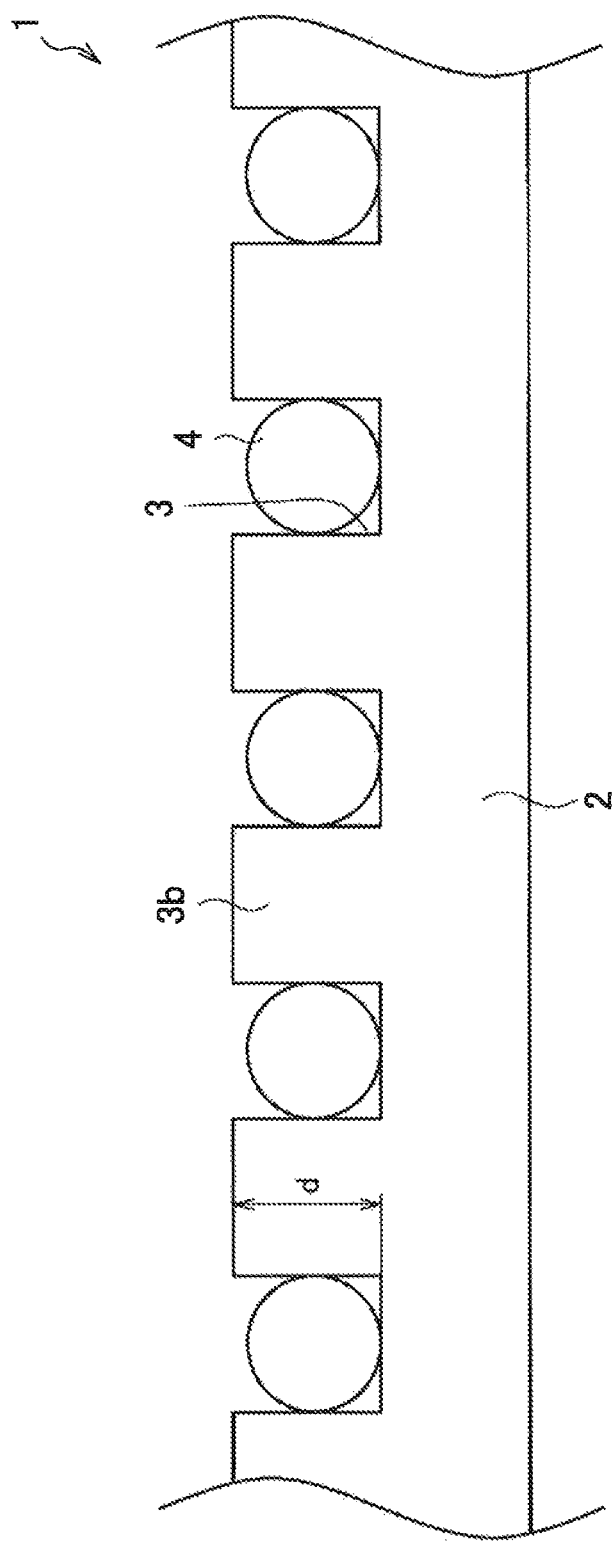
FIG. 2 is a cross-sectional side view schematically showing the configuration of the filler-filled film according to the embodiment.
Figure 3:
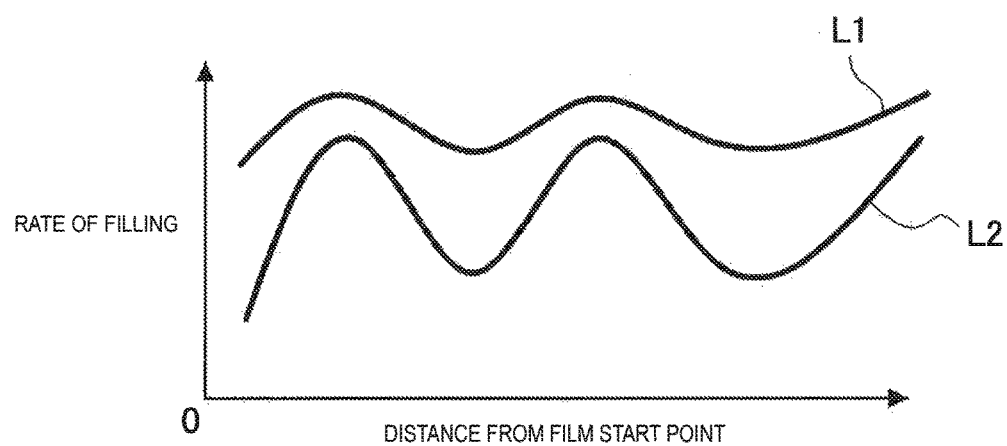
FIG. 3 is a graph schematically showing the corresponding relationship between the distance from each portion of the filler-filled film to the film start point and the filler filling rate of each portion.

First, the configuration of a filler-filled film 1 according to the present embodiment is described on the basis of FIG. 1 to FIG. 3. As shown in FIG. 1, the filler-filled film 1 includes a film main body 2, a plurality of concavities 3 formed on the surface of the film main body 2, and a filler 4 put in each of the concavities 3.

Figure 10:
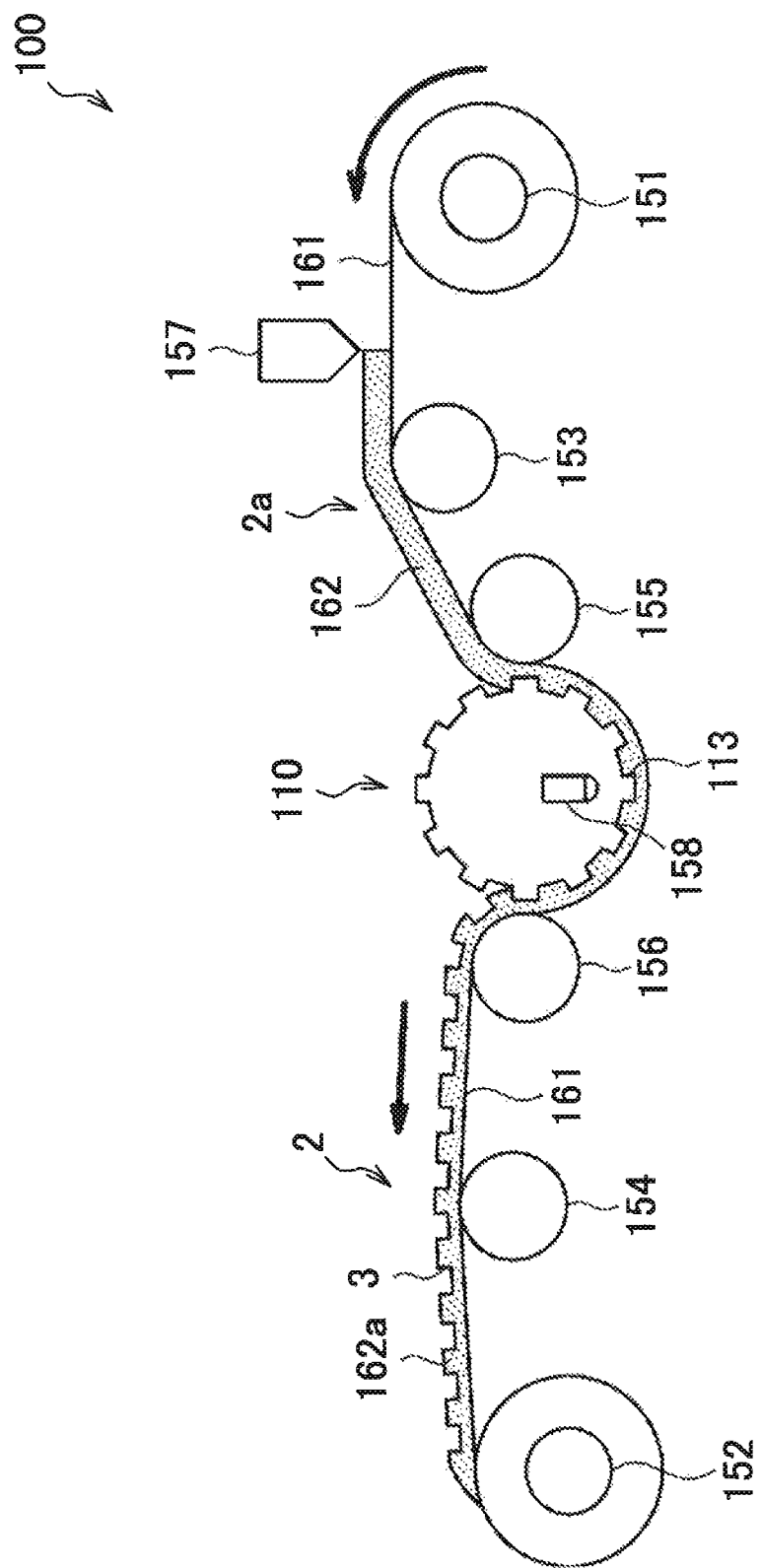
FIG. 10 is an explanatory diagram schematically showing the configuration of a transfer apparatus for producing a film main body.

The film main body 2 is a film on which a plurality of concavities 3 are formed. The material that forms the film main body 2 is not particularly questioned. For example, the film main body 2 may be formed of an arbitrary hardenable resin or plastic resin. Here, as the hardenable resin, a photocurable resin and a thermosetting resin are given. As the plastic resin, a thermoplastic resin (more specifically, a crystalline resin that melts by heat) and the like are given. Thus, the film main body 2 may be formed of at least one of a photocurable resin, a thermosetting resin, and a thermoplastic resin, for example. In the case where the film main body 2 is formed of a photocurable resin or a thermosetting resin, the film main body 2 may be composed of a sheet-like transfer destination matrix film 161 and a hardened resin layer 162a formed on the transfer destination matrix film 161 (see FIG. 10). The hardened resin layer 162a is a layer in which a photocurable resin or a thermosetting resin is hardened. The concavity 3 is formed on the surface of the hardened resin layer 162a. The film main body 2 may also be formed as a film in a state where a hardenable resin and a resin that forms the transfer destination matrix film are mixed together.

The thickness of the film main body 2 is not particularly questioned, either. The thickness of the film main body 2 may be adjusted on the basis of the presence or absence of the transfer destination matrix film 161 described above. For example, in the case where the film main body 2 includes the transfer destination matrix film 161, the thickness of the film main body 2 may be 10 to 300 μm. In this case, the thickness of the hardened resin layer 162a may be 1 to 50 μm, and the thickness of the transfer destination matrix film 161 may be 9 to 250 μm. On the other hand, in the case where the film main body 2 does not include the transfer destination matrix film 161, the thickness of the film main body 2 may be 8 to 200 μm.

The width of the film main body 2 is not particularly questioned, either. For example, the width of the film main body 2 may be 0.05 to 300 cm. The length of the film main body 2 is not particularly questioned, either. However, in the case where the film main body 2 is a long-length film, the variation of the filler filling rate described later tends to be large. Therefore, the effect of the present embodiment is exhibited more significantly in the case where the film main body 2 is a long-length film. The lower limit value of the length of the film main body 2 may be any of 5 m, 10 m, 30 m, 50 m, 100 m, 200 m, 300 m, and 500 m, for example.

A plurality of concavities 3 are formed on the surface of the film main body 2. The diameter of the opening surface of the concavity 3 is at least larger than visible light wavelengths. Here, the diameter of the opening surface of the concavity 3 is, for example, the diameter of the smallest circle encompassing the opening surface of the concavity 3 (for example, a circumscribed circle of the opening surface of the concavity 3). Specifically, the diameter of the opening surface of the concavity 3 is preferably 0.8 to 500 μm, more preferably 1.0 to 300 μm, and still more preferably larger than 1.6 μm and less than 300 μm. That is, the lower limit value is preferably 0.8 μm or more, more preferably 1.0 μm or more, and still more preferably larger than 1.6 μm. The upper limit value is preferably 500 μm or less, more preferably 300 μm or less, and still more preferably less than 300 μm.

The shape of the opening surface of the concavity 3 is not particularly questioned, and may be an arbitrary shape. For example, the shape of the opening surface of the concavity 3 may be a circle, an ellipse, a polygon, etc. In the case where the shape of the opening surface of the concavity 3 is a polygon, the diameter of the opening surface may be the length of the longest side among the sides constituting the polygon. The opening surface of the concavity 3 may be a shape including a curved line in a part of it. The area of the opening surface may not be fixed as long as the condition of the opening surface described above is satisfied. For the shape of the opening surface, an opening surface having the smallest area may be regarded as a dot, and an opening surface having an area not less than it may be categorized as a line or a plane in accordance with the shape. A linear opening surface is formed by concavities 3 each having an opening surface with the smallest area being linked linearly (that is, in a one-dimensional direction). A planar opening surface is formed by concavities 3 each having an opening surface with the smallest area being linked planarly (that is, in two-dimensional directions). Thus, a linear and a planar concavity 3 may be regarded as a set of concavities 3 each having an opening surface with the smallest area. The shapes of the line and the plane are not particularly limited. The set of concavities 3 may be a combination of a plane and a line that are linked together. The set of concavities 3 are measured as one concavity 3. The concave-convex shape shown in FIG. 1 may be inverted. That is, the concavity 3 may form a convexity, and a convexity 3b between concavities 3 (see FIG. 2) may form a concavity.

The depth d of the concavity 3 (see FIG. 2) is not particularly questioned. For example, the depth d may be 0.08 to 30 µm. The depth d is preferably 0.08 to 15 µm. In the case where the opening surface of the concavity 3 is a rectangular shape (a square or a rectangle) or an approximate circle (a perfect circle, an ellipse, or a circle that can be approximated to them), the aspect ratio of the concavity 3 may be approximately 0.1 to 10. Here, the aspect ratio is a value obtained by dividing the diameter of the opening surface by the depth d.

When the depth of the concavity 3 is more than 30 µm or the aspect ratio of the concavity 3 is more than 10, the formation of the concavity 3 is difficult; thus, this is not preferable. When the depth of the concavity 3 is less than 0.08 µm or the aspect ratio of the concavity 3 is less than 0.1, the filling of the filler 4 may be difficult; thus, this is not preferable.

In the case where the film main body 2 includes the transfer destination matrix film 161, the concavity 3 may penetrate through the hardened resin layer 162a. However, regardless of whether the film main body 2 includes the transfer destination matrix film 161 or not, the concavity 3 preferably does not penetrate through the film main body 2.

The shapes (the shapes of the opening surfaces and the cross-sectional shapes (the cross-sectional shapes shown in FIG. 2)) of the concavities 3 are preferably substantially the same throughout the entire film main body 2. When the cross-sectional shapes or the shapes of the opening surfaces of the concavities 3 are substantially the same, the grasp of the formation condition of the concavities 3 in the filler-filled film 1 is easier; thus, this is preferable.

The arrangement pattern of concavities 3 has periodicity along the length direction P of the film main body 2. Specifically, the arrangement pattern of concavities 3 is an arrangement pattern in which a unit arrangement pattern M is repeated in the length direction of the film main body 2. In the example of FIG. 1, the unit arrangement pattern M is composed of two rows of concavities 3 aligned in the direction perpendicular to the length direction P. The concavities 3 of each row are aligned at equal intervals. Further, the concavities 3 of each row are arranged between the concavities 3 of the other row. The unit arrangement pattern M is repeated along the length direction P; thereby, a hexagonal lattice arrangement pattern is formed. The hexagonal lattice arrangement pattern is an example of the pattern in which concavities 3 are arranged most densely. The arrangement pattern is not limited to this example, as a matter of course. For example, the arrangement pattern may be a square lattice arrangement pattern. In this case, the unit arrangement pattern is composed of one row of concavities 3 aligned in the direction perpendicular to the length direction P. The concavities 3 in the row are arranged at equal intervals. As other arrangement patterns, lattice forms such as an orthorhombic lattice and a parallel body lattice are given. Further, an arbitrary depiction (pointillism) is possible.

The width MW of the unit arrangement pattern M coincides with the width of the film main body 2. On the other hand, the length ML of the unit arrangement pattern M is not particularly limited. For example, in the case where the arrangement pattern of convexities 113 formed on the peripheral surface of a master 110 described later (see FIG. 10) does not have periodicity, the length ML coincides with the length of the circumference of the master 110. On the other hand, in the case where the arrangement pattern of convexities 113 has periodicity along the round direction of the master 110, that is, in the case where the unit arrangement pattern of convexities 113 is repeated in the round direction of the master 110, the length ML coincides with the length of the unit arrangement pattern of convexities 113 (the length in the round direction of the master 110). The length ML of the unit arrangement pattern M is at the minimum in the case where the unit arrangement pattern M is composed of one row of concavities 3. That is, in this case, the length ML is approximately the diameter of the concavity 3. On the other hand, the length ML is at the maximum in the case where the arrangement pattern of convexities 113 does not have periodicity. In this case, the length ML coincides with the length of the circumference of the master 110. Thus, the range of the length ML of the unit arrangement pattern M is very wide. The diameter of the master 110 is not particularly limited, and is, for example, 50 to 300 mm.

Here, the arrangement pattern of concavities 3 may have periodicity also in a direction going straight in the length direction of the film main body 2 (the width direction of the film main body 2). That is, the same arrangement pattern may be repeated along the width direction of the film main body 2. The periodicity along the length direction P of the film main body 2 and the periodicity in a direction going straight in this direction may be the same or different. This is because substantially the same sheet film can be obtained when the filler-filled film 1 is made into sheets.

The surface density of concavities 3, that is, the number of concavities 3 formed per unit area of the film main body 2 is not particularly limited. For example, the number may be 50,000,000/cm$^2$ or less. When the surface density of concavities 3 is more than 50,000,000/cm$^2$, the contact area between the master 110 and the film main body 2 is increased at the time of forming the concavities 3 and the releasability between the master 110 and the film main body 2 is reduced, and it is difficult for the concavities 3 to be formed; thus, this is not preferable. The lower limit value of the surface density of concavities 3 is not particularly limited, and may be, for example, 100/cm$^2$ or more.

In the case where one filler 4 is put in one concavity 3, the surface density of concavities 3 coincides with the surface density of fillers 4, that is, the number of fillers 4 put in per unit area of the film main body 2. The distance between concavities 3 is not particularly limited, either. For example, the lower limit value of the distance between concavities 3 may be 0.5 µm. More specifically, the lower limit value of the distance between concavities 3 is preferably ⅝or more, more preferably ½or more, of the minimum diameter of the filler 4. The upper limit value of the distance between concavities 3 is not particularly limited, and may be approximately 1000 µm. Here, the distance between concavities 3 may be the distance between the center points of opening surfaces.

Although the loss of the concavity 3 may occur in the length direction P consecutively, the number of consecutive losses is very small even in such a case. Here, the loss of the concavity 3 means that the concavity 3 has not been formed (in other words, the shape of the convexity 113 (see FIG. 10) has not been transferred to the film main body 2). The consecutive losses in the length direction P means losses occurring consecutively on a straight line parallel to the length direction P. In the present embodiment, the number of consecutive losses in the length direction P is 10 or less, preferably 5 or less.

Figure 13:
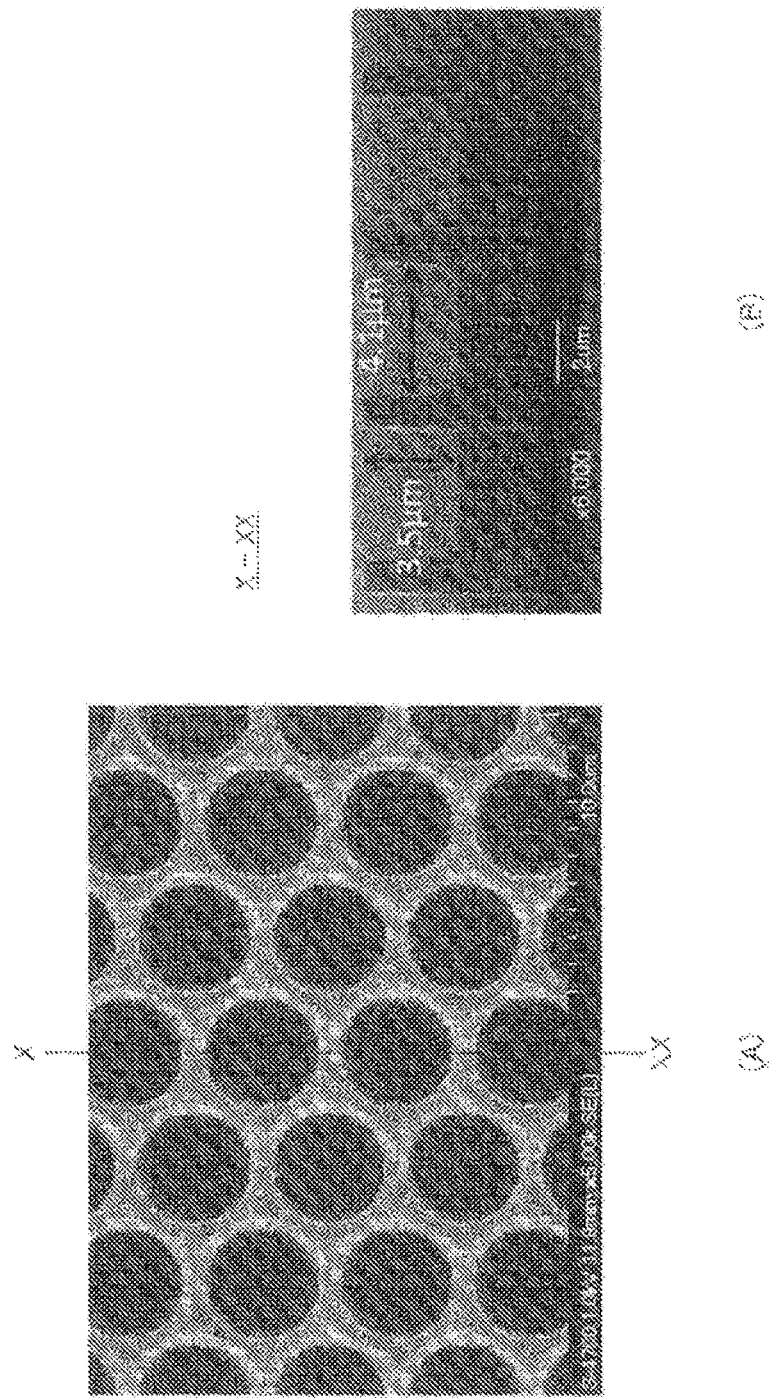
FIG. 13 is scanning electron microscope (SEM) photographs showing an example of the film main body.
Figure 14:
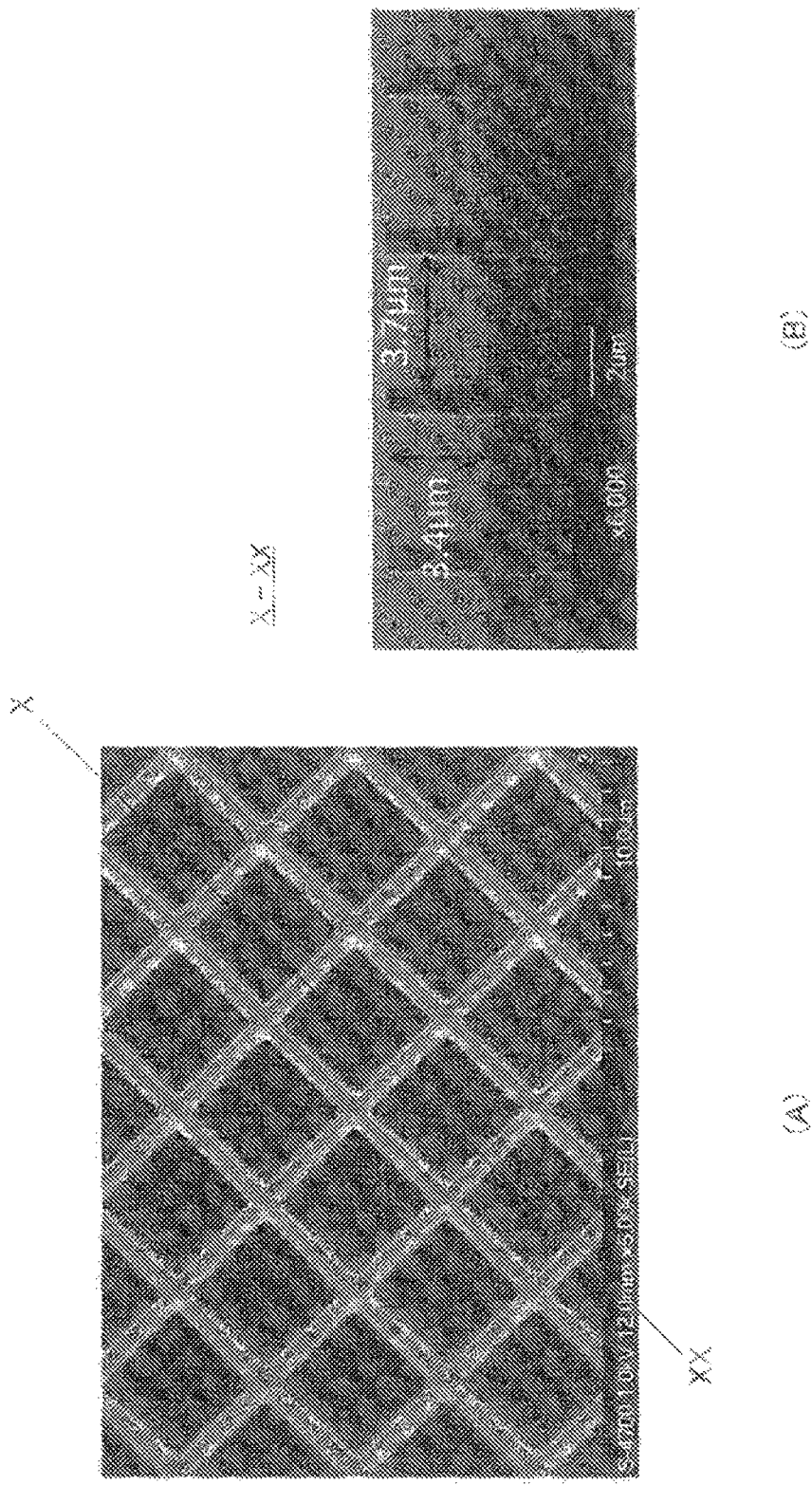
FIG. 14 is SEM photographs showing an example of the film main body.

FIG. 13 and FIG. 14 show examples of the film main body 2. Both of FIG. 13 and FIG. 14 are SEM photographs of film main bodies 2. FIG. 13A and FIG. 14A are SEM images in which the surface of the film main body 2 is observed, and FIG. 13B and FIG. 14B are SEM images in which a cross section of the transfer copy shown in FIG. 13A and FIG. 14A taken along line X-XX is observed. The vertical direction of FIG. 13A and FIG. 14A is the length direction P of FIG. 1, and the left and right direction is the width direction of the film main body 2. In FIG. 13A, the shape of the opening surface is a circle, and the arrangement pattern of concavities 3 is a hexagonal lattice arrangement pattern. In FIG. 14A, the shape of the opening surface is a square, and the arrangement pattern of concavities 3 is a square lattice arrangement pattern.

The filler 4 is a material that is put in the concavity 3. The putting-in (filling) refers to a state where the greater part of the filler is buried in the concavity 3. It is preferable that one filler 4 be put in one concavity 3. However, there may be a case where a plurality of fillers 4 are put in a set of concavities 3. The material (composition) that forms the filler 4 is not particularly questioned, and may be selected in accordance with the use of the filler-filled film 1, as appropriate. For example, as the filler 4, an inorganic substance, an organic substance, a material in which an inorganic substance has a multiple-layer structure, a material in which an inorganic substance (inorganic material) and an organic substance (organic material) coexist (for example, a material in which a minute solid body made of an organic substance is coated with an inorganic substance), and the like may be used. Specifically, the filler 4 may be a pigment, a dye, a crystalline inorganic substance, or the like. The filler 4 may also be a material in which a crystalline organic material or inorganic material is pulverized. It is possible for all the concavities 3 to be filled with the same filler 4, or to be filled with different types of fillers 4. For example, in the case where the diameters of the opening surfaces of concavities 3 are different, fillers 4 with diameters in accordance with them may be put in. The shape of the filler 4 is not particularly questioned. The shape of the filler 4 may be a shape having isotropy, such as a spherical shape. The specific gravity of the filler is not particularly limited, and may be, for example, 0.8 to 23. For the size of the filler, it is preferable that the maximum length of the filler be not more than the minimum length of the opening surface of the concavity 3. The filler may be provided with various properties or various types of functionality.

The filler 4 may be integrated with the film main body 2 in the concavity 3. The integration with the film main body 2 may be performed by, for example, putting the filler 4 in the concavity 3 in a state where only part of the concavity 3 is hardened and then completely hardening the concavity 3. Alternatively, after the filler 4 is put in the concavity 3, an unhardened hardenable resin may be applied or sprayed to the surface of the filler-filled film 1, and the hardenable resin may be hardened.

In the present embodiment, the rate of filling of fillers 4 (hereinafter, occasionally referred to as "the filler filling rate") is very stable. That is, the difference between the filler filling rate in one end portion F of the film main body 2 and the filler filling rate in another portion of the film main body 2 is less than 0.5%, preferably 0.3% or less, and more preferably 0.1% or less.

Here, the one end portion F is an end portion on the side where the concavity 3 is first formed by the master 110 described later, that is, the start point of transfer. On the other hand, the other end portion R is an end portion on the side where the concavity 3 is formed last by the master 110, that is, the finish point of transfer. In the present embodiment, the direction from the one end portion F toward the other end portion F is defined as the positive direction of the length direction P. The filler filling rate in each portion (place) of the film main body 2 is calculated in the following manner, for example.

That is, a unit arrangement pattern M including a portion of attention is extracted, and a prescribed number m (m is an arbitrary integer of 0 or more) of unit arrangement patterns M that are placed on the positive direction side in the length direction P with respect to the unit arrangement pattern M mentioned above are extracted. The extracted unit arrangement patterns M are taken as an area to be measured.

Then, a plurality of representative areas are set in the area to be measured, and the number of fillers 4 in each representative area is measured by optical microscope observation or the like. Then, the sum total of the measurement values of the representative areas is divided by the sum total of the ideal numbers of fillers 4 present in the representative areas; thus, the filler filling rate is measured. Here, the ideal number of fillers 4 present in the representative area is the number of fillers 4 that are supposed to be present in the representative area. That is, it is the number of fillers 4 measured on the assumption that there is no loss of the concavity 3 in the representative area and all the concavities 3 in the representative area are filled with the filler 4 in the right amount.

There is a case where the filler filling rate is below 100(%), due to some cause. As the cause, a position shift of the concavity 3 (an event in which the concavity 3 is formed in a position different from the position where it is originally supposed to be formed), a loss and a warp (becoming a shape different from the original shape) of the concavity 3, etc. are given. When a position shift or a warp of the concavity 3 has occurred, there is a possibility that the filler 4 will not be put in the concavity 3. When a loss of the concavity 3 has occurred, the concavity 3 that the filler 4 is supposed to be put in does not exist. Therefore, the filler filling rate is reduced in all these cases. In FIG. 1, two concavities 3a are lost in a unit arrangement pattern M in place X. Furthermore, one concavity 3a is lost in a unit arrangement pattern M in the other end portion R.

There may be various types of distribution of the filler filling rate. For example, the filler filling rate may have periodicity along the length direction P. Specifically, as shown in graph L1 of FIG. 3, the filler filling rate in the portions may have a distribution waved along the length direction P.

Here, the horizontal axis of FIG. 3 represents the distance from the start point of the film main body 2 to each portion on the film main body 2 (that is, the longitudinal distance), and the vertical axis represents the filler filling rate. Graph L1 shows the corresponding relationship between the longitudinal distance of the filler-filled film 1 according to the present embodiment and the filler filling rate. On the other hand, graph L2 shows the corresponding relationship between the longitudinal distance of a conventional (that is, produced using a stamper master) filler-filled film and the filler filling rate.

As shown in graphs L1 and L2, in both of the filler-filled film 1 according to the present embodiment and the conventional filler-filled film, the filler filling rate has a distribution waved along the length direction. However, while the variation of the filler filling rate is small in the filler-filled film 1 according to the present embodiment, the variation of the filler filling rate is very large in the conventional filler-filled film. In the conventional filler-filled film, the variation of the filler filling rate becomes larger as the film main body becomes longer. In contrast, in the present embodiment, the variation of the filler filling rate can be suppressed even when the film main body 2 is longer, as shown in Example described later. That is, in the present embodiment, the difference between the filler filling rate in each portion and the filler filling rate in the one end portion F can be suppressed to less than 0.5%.

<2. Various Modification Examples>

Figure 4:
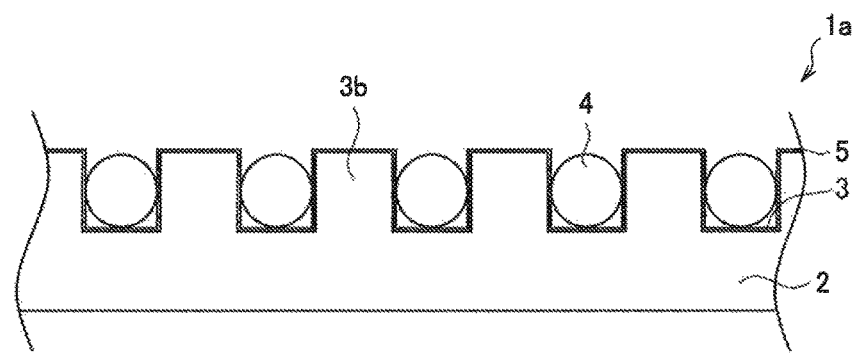
FIG. 4 is a cross-sectional side view schematically showing a modification example of the filler-filled film.

Next, various modification examples of the filler-filled film 1 are described on the basis of FIG. 4 to FIG. 9. A filler-filled film 1a shown in FIG. 4 is one in which a coating layer 5 is added to the filler-filled film 1 described above. The coating layer 5 covers the surface of the film main body 2, that is, the surface (the wall surface and the bottom surface) of the concavity 3 and the surface (the top surface) of the convexity 3b between concavities 3. The coating layer 5 may cover only either one of the surface of the concavity 3 and the surface of the convexity 3b. The filler 4 is put in the concavity 3 covered with the coating layer 5.

Here, the material (composition) that forms the coating layer 5 is not particularly limited, and may be an organic material or an inorganic material. The material that forms the coating layer 5 may be selected in accordance with the use of the filler-filled film 1a as appropriate, but is preferably formed of a different material from the film main body 2. For example, the coating layer 5 may be an inorganic layer. The coating layer 5 is formed by, for example, vapor-depositing the material that forms the coating layer 5 on the film main body 2. The layer thickness of the coating layer 5 is not particularly questioned, but is preferably substantially uniform on the surface of the film main body 2 regardless of the shape of the concavity 3. The portion formed on the surface of the concavity 3 is preferably formed on the surface of the concavity 3 at a ratio of 30 volume % or less of the hollow portion of the concavity 3. The method of vapor deposition is not particularly questioned. For example, oblique vapor deposition may be performed, and thereby the coating layer 5 may be formed on only part of the concavity 3 (that is, with inclination). In this case, the wall surface of the concavity 3 can be inclined, and therefore the filler 4 can be put in the concavity 3 easily. In the case where the coating layer 5 is formed of an organic material, the coating layer 5 may be formed by applying or spraying the organic material. Also at this time, the opening surface and the spraying direction may be mutually inclined.

Figure 5:
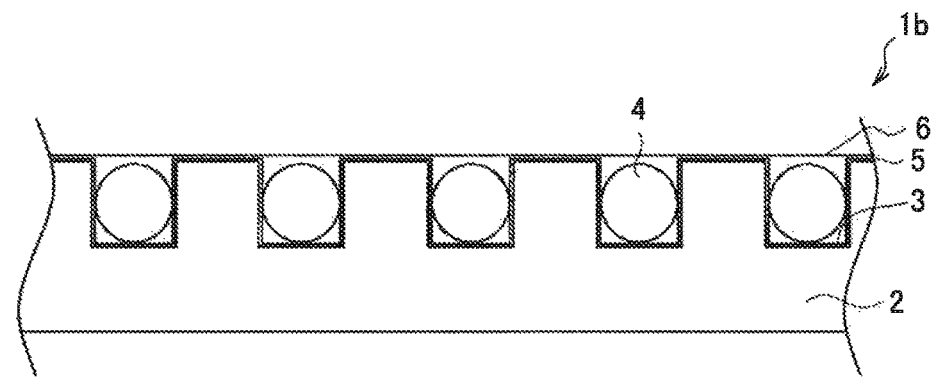
FIG. 5 is a cross-sectional side view schematically showing a modification example of the filler-filled film.

A filler-filled film 1b shown in FIG. 5 is one in which a coating layer 6 is further formed on the surface of the filler-filled film 1a shown in FIG. 4. The coating layer 6 covers the portion covering the convexity 3b of the coating layer 5 and the exposed surface of the filler 4. Here, the exposed surface of the filler 4 refers to the surface exposed to the outside via the opening surface of the concavity 3. The material that forms the coating layer 6 is not particularly limited either, and may be an organic material or an inorganic material. The material that forms the coating layer 6 may be selected in accordance with the use of the filler-filled film 1b, as appropriate. For example, the coating layer 6 may be formed of the same inorganic material as the coating layer 5, or may be formed of a different inorganic material. The coating layer 6 is formed by a similar method to the coating layer 5.

Figure 6:
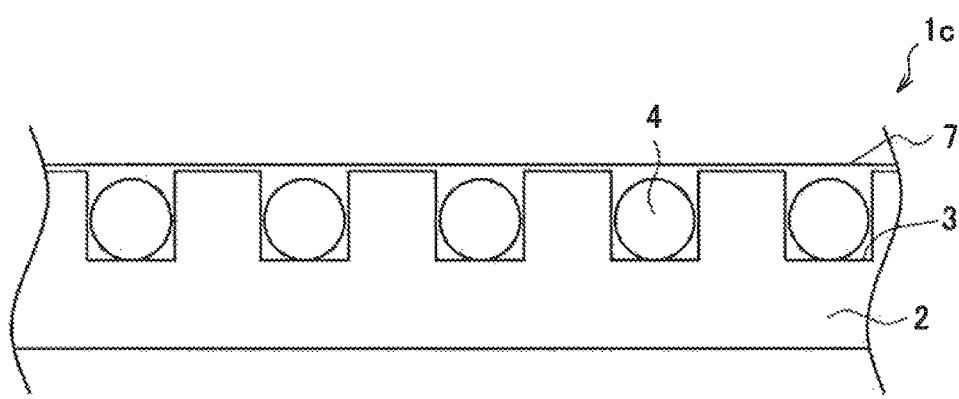
FIG. 6 is a cross-sectional side view schematically showing a modification example of the filler-filled film.

A filler-filled film 1c shown in FIG. 6 is one in which a coating layer 7 is formed on the surface of the filler-filled film 1. The coating layer 7 covers the surface of the convexity 3b and the exposed surface of the filler 4. The material (composition) that forms the coating layer 7 is not particularly limited, and may be an organic material or an inorganic material. The material that forms the coating layer 7 may be selected in accordance with the use of the filler-filled film 1c, as appropriate. For example, the coating layer 7 may be an inorganic layer. The coating layer 7 is formed by a similar method to the coating layer 5.

Figure 7:
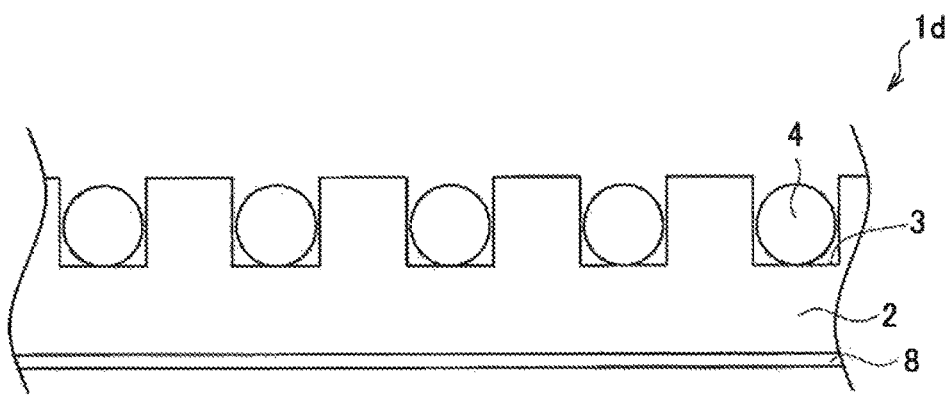
FIG. 7 is a cross-sectional side view schematically showing a modification example of the filler-filled film.

A filler-filled film 1d shown in FIG. 7 is one in which a sticky layer 8 is formed on the back surface of the film main body 2 (the surface on the opposite side to the surface on which the concavity 3 is formed). The filler-filled film 1d may be bonded to another object (for example, another filler-filled film according to the present embodiment, any matrix, etc.) via the sticky layer 8. The sticky layer 8 may be formed also on the filler-filled films 1a to 1c shown in FIGS. 4 to 6, as a matter of course.

Figure 8:
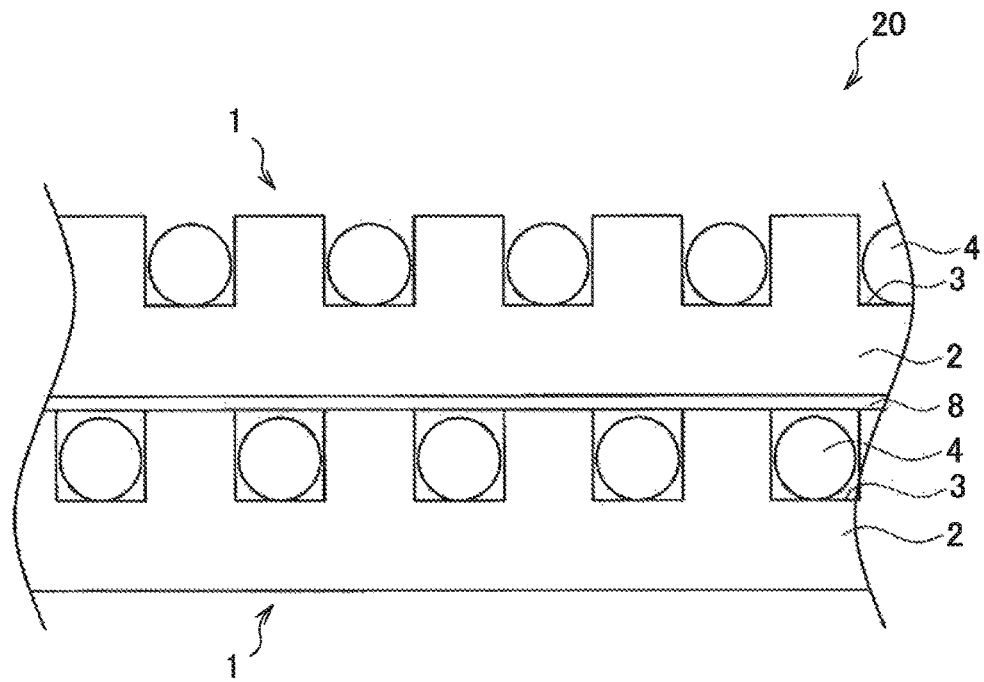
FIG. 8 is a cross-sectional side view schematically showing a modification example of the filler-filled film.

A stacked film 20 shown in FIG. 8 is one in which two filler-filled films 1 are bonded together via the sticky layer 8. Although the number of stacked sheets is two in the stacked film 20 shown in FIG. 8, the number of stacked sheets is not limited to this, as a matter of course. The arrangement patterns of concavities 3 of the filler-filled films 1 may be the same or different. For example, the arrangement patterns of concavities 3 of the filler-filled films 1 may be similar to each other. The filler-filled films 1 may be filled with the same filler 4, or may be filled with different fillers 4 individually.

The stacked film 20 may be produced by stacking the filler-filled film 1d shown in FIG. 7. Alternatively, the stacked film 20 may be produced by repeating a process in which the sticky layer 8 is formed on the surface of a filler-filled film 1 by coating and another filler-filled film 1 is bonded onto it. Also the filler-filled films 1a to 1c shown in FIGS. 4 to 6 may be stacked, as a matter of course.

Figure 9:
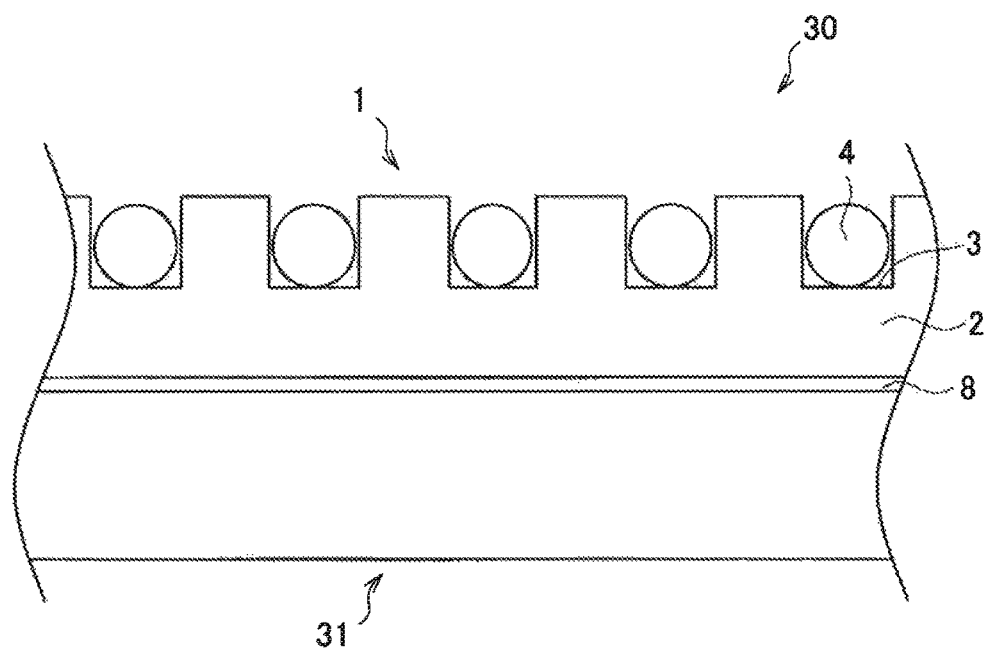
FIG. 9 is a cross-sectional side view schematically showing a modification example of the filler-filled film.

A bonded body 30 shown in FIG. 9 is one in which the filler-filled film 1 is bonded to the surface of a matrix 31 via the sticky layer 8. The type of the matrix 31 is not particularly limited. The matrix 31 may be a planar member (for example, a film or a plate), or may be a three-dimensional member (for example, various casings etc.). Also the filler-filled films 1a to 1d, the stacked film 20, and a sheet film described below may be bonded to the matrix 31.

<3. Sheet Film>

The filler-filled film 1 described above may be cut into a plurality of sheets to be made into sheet films. Since the filler filling rate can be stabilized in the entire area of the filler-filled film 1 according to the present embodiment, a plurality of sheet films of the same quality can be produced. Also the films according to the modification examples described above may be similarly made into sheet films.

The use of the films mentioned above is not particularly limited; the films may be used for, for example, printed electronics and fields of application thereof (related fields), etc. Further, the films may be used, as well as for the fields described above, as a functional film (device). For example, the films may be used for medical treatment, bioscience, health care, life science, etc., such as a biosensor and a diagnostic device, or may be used as an optical element. Further, the film may be used for battery-related and energy-related fields, and vehicle-related fields (the automotive field).

<4. Configuration of Transfer Apparatus>

The film main body 2 can be produced by a transfer apparatus of a roll-to-roll system. The configuration of a transfer apparatus 100 that is an example of the transfer apparatus will now be described with reference to FIG. 10. In the transfer apparatus 100 shown in FIG. 10, the film main body 2 is produced using a photocurable resin.

The transfer apparatus 100 includes a master 110, a matrix supply roll 151, a winding roll 152, guide rolls 153 and 154, a nip roll 155, a peeling roll 156, a coating apparatus 157, and a light source 158.

The master 110 is a circular cylindrical or circular columnar member, and a plurality of convexities 113 are formed on the peripheral surface of the master 110. The convexities 113 have the inverted shape of the concavities 3 described above. That is, in the transfer apparatus 100, the arrangement pattern of convexities 113 formed on the peripheral surface of the master 110 is transferred to a transfer destination film 2a, and thereby the film main body 2 is produced.

The material that forms the master 110 and the size (diameter etc.) of the master 110 are not particularly questioned. For example, the master 110 may be formed of quartz glass ($SiO_2$) such as fused quartz glass or synthetic quartz glass, or stainless steel or the like. The diameter (outer diameter) of the master 110 may be 50 to 300 mm. In the case where the master 110 is in a circular cylindrical shape, the thickness may be 2 to 50 mm.

The method for forming the convexity 113 on the peripheral surface of the master 110 is not particularly questioned. For example, the convexity 113 may be produced by mechanically cutting the peripheral surface of the master 110, or may be produced by etching. An overview of the process of producing the master 110 by etching is as follows. That is, the peripheral surface of a circular cylindrical or circular columnar matrix is covered with a resist layer. Subsequently, laser light is applied to the portion of the resist layer where the convexity 113 will not be formed (the portion that forms a concavity), and thereby a latent image is formed on the resist layer. An example of the configuration of the exposure apparatus that applies laser light to the matrix is described later. Subsequently, the resist layer is developed, and thereby the latent image portion is removed. Subsequently, the resist layer is used as a mask to etch the matrix. Thereby, the portion between convexities 113 is etched, and therefore convexities 113 are formed. The peripheral surface of the master 110 may be provided with marking that indicates positions on the peripheral surface of the master 110. By transferring such marking to the transfer destination film 2a, the progress of transfer can be checked. Instead of providing marking on the master 110, part of the convexities 113 to be formed on the master 110 may be formed with a shift intentionally. In this case, also the position of the concavity 3 corresponding to this convexity 113 is shifted; thus, this concavity 3 serves as a substitute for marking. It is preferable that the position shift of the convexity 113 be set within a range in which the quality of the film main body 2 is not influenced.

Figure 12:
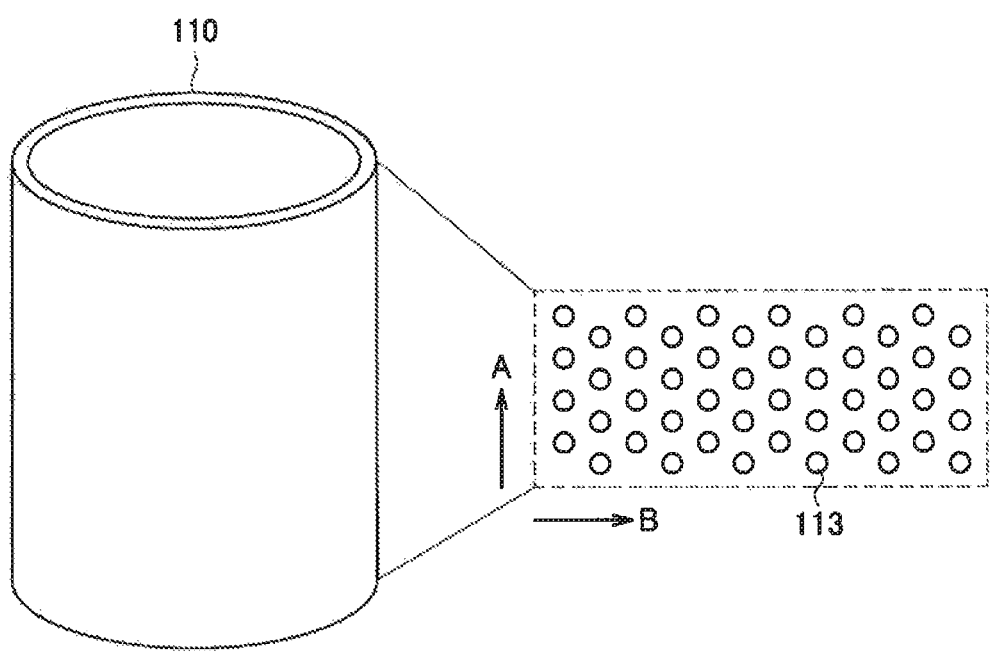
FIG. 12 is a perspective view schematically showing an example of the configuration of a master.

FIG. 12 shows an example of the master 110. A plurality of convexities 113 are formed on the peripheral surface of the master 110. The arrangement pattern of convexities 113 is the inverted shape of the arrangement pattern of concavities 3 shown in FIG. 1. That is, the arrangement pattern of convexities 113 is a hexagonal lattice arrangement pattern, and has periodicity in both the axial direction A and the round direction B of the master 110.

The matrix supply roll 151 is a roll around which a long-length transfer destination matrix film 161 is wound in a roll form, and the winding roll 152 is a roll that winds the film main body 2. The guide rolls 153 and 154 are rolls that convey the transfer destination matrix film 161. The nip roll 155 is a roll that sticks the transfer destination matrix film 161 on which an unhardened resin layer 162 is stacked, that is, the transfer destination film 2a to the master 110. The peeling roll 156 is a roll that peels off the transfer destination matrix film 161 on which a hardened resin layer 162a is stacked, that is, the film main body 2 from the master 110.

The coating apparatus 157 includes a coating means such as a coater, and applies an uncured photocurable resin composition to the transfer destination matrix film 161 to form the unhardened resin layer 162. The coating apparatus 157 may be, for example, a gravure coater, a wire bar coater, a die coater, or the like. The light source 158 is a light source that emits light of a wavelength capable of curing the photocurable resin composition, and may be, for example, an ultraviolet lamp or the like.

The photocurable resin composition is a resin that decreases in fluidity and cures by being irradiated with light of a prescribed wavelength. Specifically, the photocurable resin composition may be an ultraviolet curable resin such as an acrylic resin. The photocurable resin composition may contain an initiator, a filler, a functional additive, a solvent, an inorganic material, a pigment, an antistatic agent, a sensitizing dye, etc., as necessary.

In the transfer apparatus 100, first, the transfer destination matrix film 161 is continuously fed from the matrix supply roll 151 via the guide roll 153. The matrix supply roll 151 may be switched to the matrix supply roll 151 of another lot in the course of feeding. The uncured photocurable resin composition is applied to the fed transfer destination matrix film 161 by the coating apparatus 157, and the unhardened resin layer 162 is stacked on the transfer destination matrix film 161. Thereby, the transfer destination film 2a is produced. The transfer destination film 2a is stuck to the master 110 by the nip roll 155. The light source 158 applies light to the unhardened resin layer 162 stuck to the master 110 to cure the unhardened resin layer 162. Thereby, the arrangement pattern of convexities 113 formed on the outer peripheral surface of the master 110 is transferred to the unhardened resin layer 162. That is, the hardened resin layer 162a on which concavities 3 are formed is formed. Here, the light source 158 may apply light obliquely to the concavity 3. In this case, only part of the concavity 3 is cured. Subsequently, the transfer destination matrix film 161 on which the hardened resin layer 162a is stacked, that is, the film main body 2 is peeled off from the master 110 by the peeling roll 156. Subsequently, the film main body 2 is wound by the winding roll 152 via the guide roll 154.

Thus, in the transfer apparatus 100, the transfer destination film 2a is conveyed by a roll-to-roll system, and at the same time the shape of the peripheral surface of the master 110 is transferred to the transfer destination film 2a. Thereby, the film main body 2 is produced.

In the case where the film main body 2 is produced using a thermoplastic resin, the coating apparatus 157 and the light source 158 are not needed. Further, the transfer destination matrix film 161 is made of a thermoplastic resin film, and a heating apparatus is placed on the upstream side of the master 110. The transfer destination matrix film 161 is heated and softened by the heating apparatus, and then the transfer destination matrix film 161 is pressed against the master 110. Thereby, the arrangement pattern of convexities 113 formed on the peripheral surface of the master 110 is transferred to the transfer destination matrix film 161. The transfer destination matrix film 161 may be a film formed of a resin other than a thermoplastic resin, and the transfer destination matrix film 161 and a thermoplastic resin film may be stacked. In this case, the stacked film is heated by the heating apparatus, and is then pressed against the master 110.

Thus, the transfer apparatus 100 can continuously produce a transfer copy to which the arrangement pattern of convexities 113 formed on the master 110 is transferred, that is, the film main body 2. The film main body 2 produced using the transfer apparatus 100 can suppress the occurrence of a defect of the concavity 3, and can therefore suppress the variation of the filler filling rate.

<5. Configuration of Exposure Apparatus>

Figure 11:
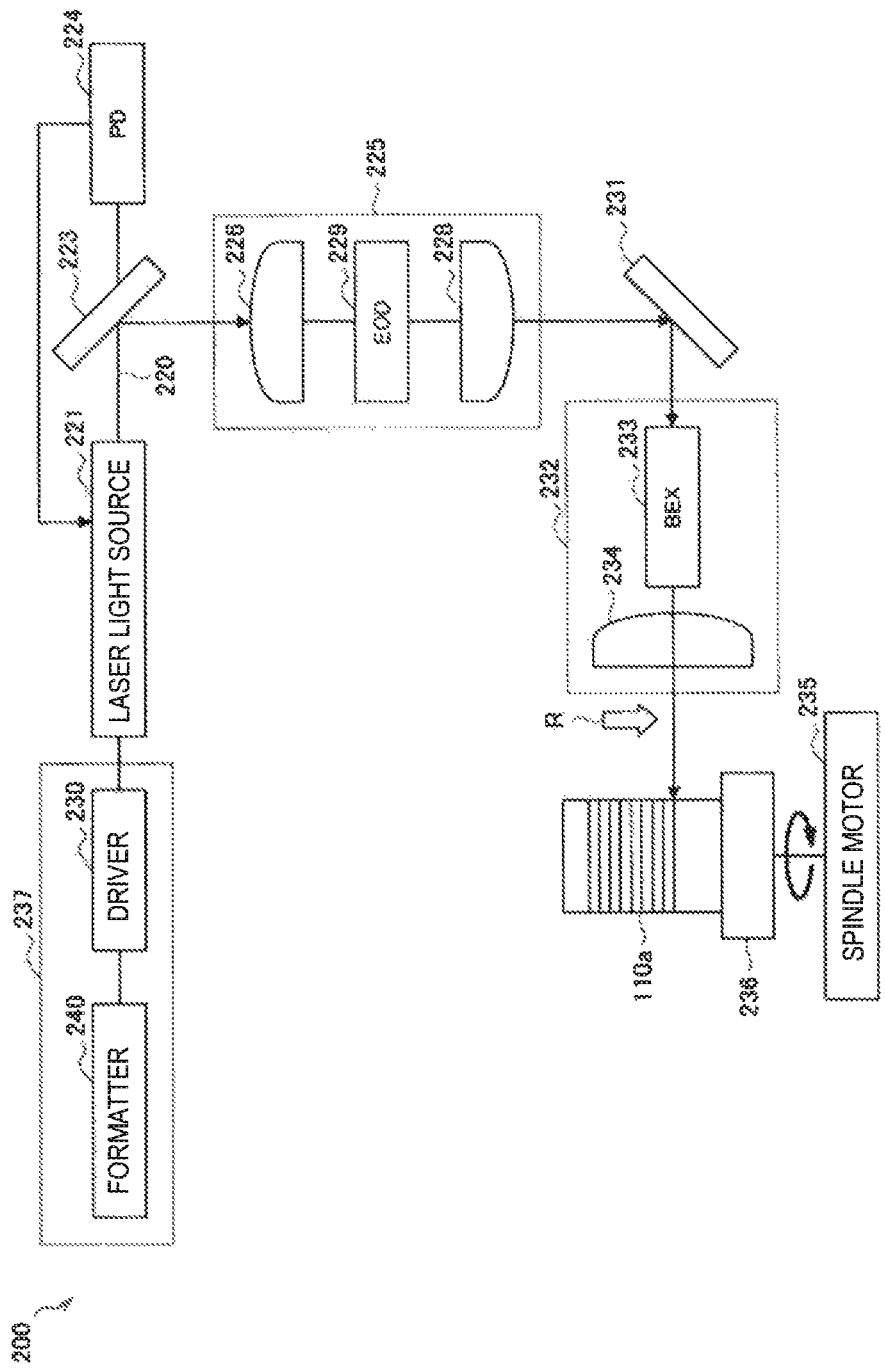
FIG. 11 is a block diagram showing an example of the configuration of an exposure apparatus.

Next, the configuration of an exposure apparatus 200 is described on the basis of FIG. 11. The exposure apparatus 200 is an apparatus that forms the master 110. The exposure apparatus 200 includes a laser light source 221, a first mirror 223, a photodiode (PD) 224, a deflection optical system 225, a control mechanism 237, a second mirror 231, a movable optical table 232, a spindle motor 235, and a turntable 236. A matrix 110a is mounted on the turntable 236, and is rotatable.

The laser light source 221 is a light source that emits laser light 220, and is, for example, a solid-state laser, a semiconductor laser, or the like. The wavelength of the laser light 220 emitted by the laser light source 221 is not particularly limited, and may be, for example, a wavelength in the blue light region of 400 nm to 500 nm. The spot diameter of the laser light 220 (the diameter of the spot applied to the resist layer) may be smaller than the diameter of the opening surface of the concavity 3, and is, for example, approximately 200 nm. The laser light 220 emitted from the laser light source 221 is controlled by the control mechanism 237.

The laser light 220 emitted from the laser light source 221 goes straight while remaining a parallel beam, and is reflected at the first mirror 223 to be guided to the deflection optical system 225.

The first mirror 223 is formed of a polarizing beam splitter, and has the function of reflecting one polarized component and transmitting the other polarized component. The polarized component transmitted through the first mirror 223 is received by the photodiode 224, and is photoelectrically converted. A light receiving signal photoelectrically converted by the photodiode 224 is inputted to the laser light source 221, and the laser light source 221 modulates the phase of the laser light 220 on the basis of the inputted light receiving signal.

The deflection optical system 225 includes a light collecting lens 226, an electro-optical deflection element (electro-optic deflector, EOD) 227, and a collimator lens 228.

In the deflection optical system 225, laser light 220 is collected to the electro-optical deflection element 227 by the light collecting lens 226. The electro-optical deflection element 227 is an element capable of controlling the irradiation position of laser light 220. By means of the electro-optical deflection element 227, the exposure apparatus 200 can also change the irradiation position of laser light 220 guided onto the movable optical table 232. After the irradiation position of laser light 220 is adjusted by the electro-optical deflection element 227, the laser light 220 is made into a parallel beam again by the collimator lens 228. The laser light 220 emitted from the deflection optical system 225 is reflected by the second mirror 231, and is guided onto the movable optical table 232 horizontally and parallel.

The movable optical table 232 includes a beam expander (BEX) 233 and an objective lens 234. The laser light 220 guided to the movable optical table 232 is shaped into a desired beam shape by the beam expander 233, and is then applied to the resist layer of the matrix 110a via the objective lens 234. The movable optical table 232 moves one feed pitch in the direction of arrow R (the feed pitch direction) every time the matrix 110a makes one rotation. The matrix 110a is placed on the turntable 236. The spindle motor 235 rotates the matrix 110a by rotating the turntable 236.

The control mechanism 237 includes a formatter 240 and a driver 230, and controls the application of laser light 220. The formatter 240 generates a modulation signal that controls the application of laser light 220, and the driver 230 controls the laser light source 221 on the basis of the modulation signal generated by the formatter 240. Thereby, the application of laser light 220 to the matrix 110a is controlled.

The formatter 240 generates a control signal for applying laser light 220 to the master 110 on the basis of an input image in which an arbitrary pattern to be depicted on the master 110 is depicted. Specifically, first, the formatter 240 acquires an input image in which an arbitrary pattern to be depicted on the master 110 is depicted. The input image is an image corresponding to a development view of the outer peripheral surface of the master 110 in which the outer peripheral surface of the master 110 is cut open in the axial direction and is spread in one plane. Next, the formatter 240 divides the input image into small areas of a prescribed size (for example, divides into a lattice form), and assesses whether the depiction pattern is included in each small area or not. Subsequently, the formatter 240 generates a control signal that makes control so that laser light 220 is applied to each small area assessed as the depiction pattern being included. The driver 230 controls the power of the laser light source 221 on the basis of the control signal generated by the formatter 240. Thereby, the application of laser light 220 to the master 110 is controlled.

<6. Method for Producing Filler-filled Film>

Next, a method for producing the filler-filled film 1 is described. First, the master 110 described above is prepared. Subsequently, the shape of the peripheral surface of the master 110 is transferred to the transfer destination film 2a using the transfer apparatus 100. Thereby, the film main body 2 is produced. Subsequently, the filler 4 is put in the plurality of concavities 3 formed on the surface of the film main body 2. Here, the method for putting the filler 4 in the concavity 3 is not particularly questioned. For example, fillers 4 are scattered on the surface of the film main body 2. Subsequently, the surface of the film main body 2 is wiped with cloth or the like. Thereby, the filler 4 can be put in the concavity 3 formed on the surface of the film main body 2. In the case where only part of the concavity 3 is hardened, the concavity 3 may be completely hardened after the filler 4 is put in the concavity 3. Thereby, the filler 4 is integrated with the film main body 2 in the concavity 3. The filler 4 put in the filler-filled film 1 may be transferred to another film or the like. Further, such a transfer film may be sequentially stacked. Further, still another film may be stacked. That is, part or all of the fillers are provided in prescribed positions of another film by repeating transfer and stacking.

EXAMPLES

Example

Next, Example of the present invention is described. In Example, the film main body 2 was produced using the transfer apparatus 100. The master 110 was produced by the following steps. Specifically, using chemical vapor deposition (CVD) with a hydrocarbon-based gas, diamond-like carbon (DLC) was formed as an intermediate layer with a film thickness of 800 nm on the outer peripheral surface of a circular cylindrical matrix 110a made of quartz glass with a thickness of 4.5 mm. Next, using the sputtering method, a tungsten oxide was formed as a resist layer with a film thickness of 55 nm on the intermediate layer.

Subsequently, thermal lithography based on laser light was performed by the exposure apparatus 100, and thus a latent image was formed on the resist layer. A blue semiconductor laser that emits laser light of a wavelength of 405 nm was used as the laser light source of the exposure apparatus 100. An arrangement pattern in which circles with a diameter of 7 μm were arranged in a hexagonal lattice form with a pitch of 10 μm (the distance between the centers of circles) was used as the light exposure pattern. The portions other than the circles with a diameter of 7 μm were exposed to light by the exposure apparatus 100 so that the circle with a diameter of 7 μm might be a convexity on the master (that is, so that the circle with a diameter of 7 μm might be the concavity 3 in the film main body 2 after transfer).

Subsequently, the matrix 110a in which the resist layer was exposed to light was developed using a 2.38 mass % tetramethylammonium hydroxide (TMAH) aqueous solution, and the resist of the light-exposed portion was dissolved.

Further, using the resist layer after development as a mask, the intermediate layer was etched by reactive ion etching with $O_2$ gas. Subsequently, using the resist layer and the intermediate layer as a mask, the matrix 110a was etched by reactive ion etching with a CF-based gas. The etching of the matrix 110a was performed until the height of the convexity 113 became 7 μm so that the aspect ratio of the concavity 3 in the film main body 2 might be 1. By the above steps, a circular cylindrical master 110 in which a concave-convex structure was formed on the outer peripheral surface was produced.

Subsequently, a photocurable resin composition containing 100 parts by mass of an acrylate resin (M208, Toagosei Co., Ltd.) and 2 parts by mass of a photopolymerization initiator (IRGCUR 184, BASF SE) was applied with a film thickness of 30 μm to a matrix film made of PET with a width of 50 cm (thickness: 50 μm). Further, using the transfer apparatus 100, the master was pressed against the matrix film, and the concave-convex structure was transferred to more than 1000 m of the matrix film. Light irradiation was performed at 1000 mJ with a high-pressure mercury lamp. Thereby, a film main body 2 in which circular concavities with a diameter of 7 μm and a depth of 7 μm (the aspect ratio: 1) were arranged in a hexagonal lattice form with a distance between the centers of concavities of 10 μm was produced.

100 representative areas each with an area of 1 mm² were extracted at random, and the number of concavities in each representative area was measured with an optical microscope. Then, the sum total of the numbers measured in the representative areas was divided by the total area of the representative areas, and thereby the surface density of concavities 3 (the number of concavities 3 formed per unit area of the film main body 2) was calculated. As a result, the surface density of concavities 3 was 11,500/mm²=1,150,000/cm². Here, the concavities 3 of the object to be counted were concavities 3 not linked to each other (the convexity 3b was present between concavities 3). That is, in the Example, concavities 3 linked to each other were assessed as a defect. Such a defect may occur due to a position shift etc. of the concavity 3.

Further, EPOSTAR MA1006 produced by Nippon Shokubai Co., Ltd was prepared, and resin fillers of this were classified so that the average diameter might be 5 μm. The diameter of the resin filler is a diameter on the assumption that each particle of the resin filler is a sphere, that is, a sphere-equivalent diameter. The average diameter is the arithmetic mean value of the diameters of the resin fillers. The classification was performed using an image particle size distribution analyzer of FPIA 3000 (manufactured by Sysmex Corporation and Malvern Instruments Ltd.). The resin filler after classification was used as the filler 4. The filling of the filler 4 was performed by the method described above. That is, fillers 4 were scattered on the surface of the film main body 2. Subsequently, the fillers 4 were wiped with cloth, and thereby the filler 4 was put in the concavity 3. Thus, the filler-filled film 1 was produced.

100 representative areas each with an area of 1 mm² were extracted at random, and the number of fillers 4 in each representative area was measured with an optical microscope. Then, the sum total of the numbers measured in the representative areas was divided by the total area of the representative areas, and thereby the surface density of fillers 4 (the number of concavities 3 formed per unit area of the film main body 2) was calculated. As a result, the surface density of fillers 4 was 11,500/mm²=1,150,000/cm². The filler 4 of the object to be counted was a filler 4 completely put in the concavity 3. Even when concavities 3 are linked to each other, the filler 4 was taken as the object to be counted when the filler 4 was completely put in the concavity 3. The object to be counted was similar in the measurement of the filler filling rate described later. When two concavities 3 are linked together, up to two fillers 4 can be put in the concavities 3.

A place 1 m from the front-end edge in the length direction P of the filler-filled film 1 (the edge to be first introduced to the master 110) is defined as one end portion F (the start point) and a place 1000 m from the front-end edge is defined as the other end portion R (the finish point), and the filler filling rates in places 1 m, 250 m, 500 m, 750 m, and 1000 m from the front-end edge were calculated.

Specifically, a unit arrangement pattern M including each place was extracted, and unit arrangement patterns M present in the range of 10 cm on the positive direction side in the length direction P with respect to the unit arrangement pattern M mentioned above (20% of the film width) were extracted. These unit arrangement patterns M were taken as an area to be measured.

Representative areas each with an area of 200 μm×200 μm were set in the area to be measured, in a total area of approximately 25 cm$^2$, and the number of fillers 4 in each representative area was measured by optical microscope observation. Then, the sum total of the measurement values of the representative areas was divided by the sum total of the ideal numbers of fillers 4 present in the representative areas, and thereby the filler filling rate was measured. The filler filling rate in each place is shown in Table 1 below. As shown in Table 1, when the length of the filler-filled film 1 was 1000 m, there was little difference between the filler filling rate in the place 1 m from the front-end edge and the filler filling rates in the places of 250 m, 500 m, 750 m, and 1000 m. Thus, for the full length of the filler-filled film 1, a stable (that is, with high reproducibility) filler filling rate was obtained in the places of 0.1%, 25%, 50%, 75%, and 100%.

TABLE 1

| Longitudinal position (m) | Rate of filling (%) |
|---|---|
| 1 | 99.9 |
| 250 | 99.9 |
| 500 | 99.9 |
| 750 | 99.9 |
| 1000 | 99.8 |

The filler filling rate was similarly measured in places every 100 m from the front-end edge, and it was found that values close to those of Table 1 were obtained. Thus, in the Example, it has been revealed that the difference between the filler filling rate in the one end portion F of the film main body 2 and the filler filling rates in other portions of the film main body 2 is 0.1% or less. Further, in the filler-filled film 1, concavities 3 are arranged in a hexagonal lattice form, that is, the densest arrangement pattern. That is, fillers 4 are put in the filler-filled film 1 in the densest arrangement pattern. Even in such an arrangement pattern, a very stable (that is, with very high reproducibility) filler filling rate has been obtained in the length direction of the filler-filled film 1. Thus, in an area where concavities 3 can be provided, similar effects are expected to be exhibited whatever arrangement pattern the fillers 4 are put in with.

Further, observation was made on consecutive losses of concavities 3 in the length direction P in the representative areas mentioned above, and a place where the number of consecutive losses was 10 or more was not found.

Comparative Example

A SUS plate of a 10 cm×10 cm size was mechanically cut, and thereby a stamper master on which convexities in a similar arrangement pattern to Example were formed was obtained. A fluorine-based mold release agent (Daifree GA70500 produced by Daikin Industries, Ltd.) was sprayed to the surface of the stamper master on which convexities were formed (the concave-convex surface). Then, similar processing was performed except that the master 110 of the transfer apparatus 100 was replaced with the stamper master; thus, a film main body was produced.

The shape of the concavity of the film main body was observed with an optical microscope, and it was found that a defect of concavities (a linkage of concavities) was present in a place where stamping was repeated 200 times (a place 20 m from the front-end edge). In view of this, the stamper was stopped at the time point when stamping was repeated more than 200 times, and a filler was put in the concavity. The filler was similar to that of Example. Then, the filler filling rate in a place 200 m from the front-end edge was measured, and the filler filling rate was found to be 99.5%. After that, the number of defects of concavities increased as the number of times of stamping increased. Therefore, it is presumed that the variation of the filler filling rate will increase as the number of times of stamping increases, and the filler filling rate will be a value lower than 99.5%.

From the above results, it has been revealed that the filler filling rate can be maintained in a higher range in Example than in Comparative Example.

Thus, in the filler-filled film 1 according to the present embodiment, the filler filling rate is more stabilized. Here, the film main body 2 may be a long-length film. In a conventional filler-filled film, the filler filling rate becomes less stable as the film main body 2 becomes longer; therefore, the effect of the present embodiment is likely to be exhibited more significantly.

The filler filling rate may have periodicity along the length direction of the film main body 2. Also in this case, the filler filling rate is stabilized.

It is possible for all the concavities 3 to have substantially the same shape. In this case, the filler filling rate can be stabilized even more.

The number of fillers put in per unit area of the film main body 2 may be 50,000,000/cm$^2$ or less. Also in this case, the filler filling rate is stabilized.

The filler 4 may be integrated with the film main body 2 in the concavity 3. In this case, wasteful loss of fillers 4 is suppressed, and therefore the filler filling rate is more stabilized.

It is also possible to include the coating layers 5, 6, and 7 formed on at least part of the surface of the film main body 2. Also in this case, the filler filling rate is stabilized. Furthermore, the use of the filler-filled film 1 is expanded by forming the coating layers 5, 6, and 7 in accordance with the use of the filler-filled film 1.

The coating layer may be formed on at least part of the surface of the concavity, the surface of the convexity between concavities, and the exposed surface of the filler. Also in this case, the filler filling rate is stabilized.

The coating layer may contain an inorganic material. Also in this case, the filler filling rate is stabilized.

The film main body may be formed of a hardenable resin or a plastic resin. Also in this case, the filler filling rate is stabilized.

In the present embodiment, the filler-filled film 1 may be made into sheet films. In this case, the quality of the sheet film is stabilized.

A stacked film in which a plurality of films are stacked may be formed. In this case, the quality of the stacked film is stabilized.

It is also possible to include a sticky layer formed on the back surface of the film main body. Thereby, the filler-filled film 1 can be bonded to another matrix 31 or the like easily.

In the present embodiment, each of the films mentioned above may be bonded to the matrix 31 to produce the bonded body 30. In this case, the function of the bonded body 30 can be stabilized. This is because the filler filling rate of the filler-filled film 1 etc. is stabilized.

The preferred embodiment(s) of the present invention has/have been described above with reference to the accompanying drawings, whilst the present invention is not limited to the above examples. A person skilled in the art may find various alterations and modifications within the scope of the appended claims, and it should be understood that they will naturally come under the technical scope of the present invention.

REFERENCE SIGNS LIST 1, 1a to 1d filler-filled film
2 film main body
3 concavity
4 filler
5, 6, 7 coating layer
8 sticky layer

The invention claimed is:

1. A filler-filled film comprising:
a film main body;
a plurality of concavities formed on a surface of the film main body; and
a filler put in each concavity of the plurality of concavities,
wherein a diameter of an opening surface of each concavity of the plurality of concavities is at least larger than a visible light wavelength,
wherein an arrangement pattern of the plurality of concavities has periodicity along a length direction of the film main body,
wherein a surface shape of each filler is different from a surface shape of the concavity in which the filler is put, and
wherein a difference between a rate of filling of the fillers in one end portion of the film main body and the rate of filling of the fillers in another portion of the film main body is less than 0.5%.

2. The filler-filled film according to claim 1, wherein the film main body is a long-length film.

3. The filler-filled film according to claim 1, wherein the rate of filling of the fillers has periodicity along the length direction of the film main body.

4. The filler-filled film according to claim 1, wherein each concavity of the plurality of concavities has substantially the same shape.

5. The filler-filled film according to claim 1, wherein the number of fillers put in per unit area of the film main body is $50,000,000/cm^2$ or less.

6. The filler-filled film according to claim 1, wherein the filler is integrated with the film main body in each concavity of the plurality of concavities.

7. The filler-filled film according to claim 1, wherein the film main body is formed of a hardenable resin or a plastic resin.

8. The filler-filled film according to claim 1, wherein a respective filler with a size corresponding to a respective concavity is put in each concavity of the plurality of concavities.

9. The filler-filled film according to claim 1, wherein the filler has a spherical shape.

10. The filler-filled film according to claim 1, wherein a difference between filler filling rates in places of 0.1%, 25%, 50%, 75%, and 100% of a full length of the filler-filled film is 0.1% or less.

11. The filler-filled film according to claim 1, wherein the number of consecutive losses of the plurality of concavities in the length direction of the film main body is 10 or less.

12. The filler-filled film according to claim 1, wherein the filler-filled film is a filler-filled film for printed electronics or a field of application of printed electronics.

13. The filler-filled film according to claim 1, wherein the filler-filled film is a filler-filled film for medical treatment or bioscience.

14. The filler-filled film according to claim 1, wherein the filler-filled film is a filler-filled film for health care.

15. The filler-filled film according to claim 1, wherein the filler-filled film is a filler-filled film for life science.

16. The filler-filled film according to claim 1, wherein the filler-filled film is a filler-filled film for an optical element.

17. The filler-filled film according to claim 1, wherein the filler-filled film is a filler-filled film for a battery or an energy-related field.

18. The filler-filled film according to claim 1, wherein the filler-filled film is a filler-filled film for a vehicle-related field.

19. A sheet film produced by cutting the filler-filled film according to claim 1 into a plurality of sheets.

20. A stacked film, wherein the film according to claim 1 is stacked.

21. The film according to claim 1, comprising a sticky layer formed on a back surface of the film main body.

22. A bonded body comprising:
the film according to claim 1; and
a matrix to which the film is bonded.

23. The filler-filled film according to claim 1, comprising a coating layer formed on at least part of a surface of the film main body.

24. The filler-filled film according to claim 23, wherein the coating layer is formed on at least part of a surface of each concavity of the plurality of concavities, a surface of a convexity between ones of the plurality of concavities, and an exposed surface of the filler.

25. The filler-filled film according to claim 23, wherein the coating layer contains an inorganic material.

26. The filler-filled film according to claim 23, wherein the coating layer is formed on the entire surface of at least one surface of the film main body.

27. A method for producing a filler-filled film, comprising:
preparing a circular cylindrical or circular columnar master in which a plurality of convexities are formed on a peripheral surface;
producing a film main body by conveying a long-length transfer destination film by a roll-to-roll system and at the same time transferring a shape of the peripheral surface of the master to the transfer destination film; and
putting a filler in each concavity of a plurality of concavities formed on a surface of the film main body,
wherein a diameter of an opening surface of each concavity of the plurality of concavities is at least larger than a visible light wavelength,
wherein a surface shape of each filler is different from a surface shape of the concavity in which the filler is put, and
wherein a difference between a rate of filling of the fillers in one end portion of the film main body and the rate of filling of the fillers in another portion of the film main body is less than 0.5%.

* * * * *